(12) United States Patent
Takahashi et al.

(10) Patent No.: US 9,394,616 B2
(45) Date of Patent: Jul. 19, 2016

(54) ETCHING COMPOSITION AND METHOD FOR PRODUCING PRINTED-WIRING BOARD USING THE SAME

(71) Applicant: MITSUBISHI GAS CHEMICAL COMPANY, INC., Tokyo (JP)

(72) Inventors: Kenichi Takahashi, Kanagawa (JP); Norifumi Tashiro, Kanagawa (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/542,913

(22) Filed: Nov. 17, 2014

(65) Prior Publication Data

US 2015/0144591 A1    May 28, 2015

(30) Foreign Application Priority Data

Nov. 22, 2013  (JP) ................................. 2013-241915

(51) Int. Cl.
*H01B 13/00* (2006.01)
*C23F 1/18* (2006.01)
*H05K 3/06* (2006.01)

(52) U.S. Cl.
CPC . *C23F 1/18* (2013.01); *H05K 3/067* (2013.01)

(58) Field of Classification Search
CPC .......... C09K 13/06; C23F 1/08; H05K 3/067
USPC .............................. 216/34, 13; 252/79.1–79.4
See application file for complete search history.

(56) References Cited

U.S. PATENT DOCUMENTS

| | | | |
|---|---|---|---|
| 4,917,758 A * | 4/1990 | Ishizuka et al. | 216/20 |
| 7,232,528 B2 * | 6/2007 | Hosomi et al. | 252/79 |
| 2005/0061202 A1 | 3/2005 | Hosomi et al. | |
| 2015/0034590 A1 * | 2/2015 | Takahashi et al. | 216/20 |

FOREIGN PATENT DOCUMENTS

| | | |
|---|---|---|
| JP | 2000-297387 | 10/2000 |
| JP | 2003-3283 | 1/2003 |
| JP | 2005-213526 | 8/2005 |
| JP | 2006-9122 | 1/2006 |
| JP | 2006-13340 | 1/2006 |
| JP | 2009-149971 | 7/2009 |

* cited by examiner

*Primary Examiner* — Duy Deo
*Assistant Examiner* — Maki Angadi
(74) *Attorney, Agent, or Firm* — Greenblum & Bernstein, P.L.C.

(57) ABSTRACT

The present invention can provide an etching composition for a chemical copper plating for the production of a printed-wiring board according to a semi-additive process, which comprises 0.2 to 5% by mass of hydrogen peroxide, 0.5 to 10% by mass of sulfuric acid, 0.001 to 0.3% by mass of phenylurea, 0.1 to 3 mass ppm of halogen ion and 0.003 to 0.3% by mass of tetrazoles, and wherein the ratio of the dissolution rate of the chemical copper plating (Y) to the dissolution rate of an electrolytic copper plating (X) at a liquid temperature of 30° C. (Y/X) is 4 to 7.

8 Claims, 2 Drawing Sheets

ETCHING COMPOSITION AND METHOD FOR PRODUCING PRINTED-WIRING BOARD USING THE SAME

TECHNICAL FIELD

The present invention relates to an etching composition to be used for removal by etching of a chemical copper plating that is a seed layer in a semi-additive process in the production of a multi-layer printed-wiring board to be used for electrical devices, electronic devices, etc., and a method for producing a printed-wiring board using the same.

BACKGROUND ART

Recently, with miniaturization, reduction in weight and sophistication of electronic devices, refinement and multilayering of copper wiring have been strongly desired for printed-wiring boards.

A semi-additive process is one of production methods for forming a micro wiring. According to this method for forming a wiring, a metal layer called a seed layer is formed on an insulation material (as the metal layer, a chemical copper plating is generally used), a plating resist layer is formed on the surface thereof, and after that, exposure and development are performed to form a resist pattern. After that, an electrolytic copper plating is provided, the resist is stripped, and the seed layer is removed by etching to form a copper wiring.

As copper etching solutions for the semi-additive process, for example, an etching solution containing hydrogen peroxide, sulfuric acid, azoles and bromine ion (Patent Document 1), an etching agent comprising sulfuric acid, hydrogen peroxide and a benzotriazole derivative (Patent Document 2) and an etching solution comprising hydrogen peroxide and sulfuric acid as the main components and azoles as additives (Patent Document 3) are disclosed, and as copper etching solutions, for example, an etching solution containing hydrogen peroxide, sulfuric acid, aminotetrazole and phenylurea (Patent Document 4), an etching solution containing hydrogen peroxide, mineral acid, azoles, silver ion and halogen (Patent Document 5) and an etching solution containing hydrogen peroxide, sulfuric acid, benzotriazoles and chloride ion (Patent Document 6) are disclosed.

Recently, the width of copper wiring has been decreased from conventional 10-20 μm to less than 10 μm, and moreover, decrease to several μm has been studied for next-generation products. Since the dissolution rate of a chemical copper plating is not higher than the dissolution rate of an electrolytic copper plating when using a conventional etching solution, the width of copper wiring has been significantly decreased. Alternatively, when the dissolution rate of a chemical copper plating is extremely higher than the dissolution rate of an electrolytic copper plating, excessive dissolution of the chemical copper plating portion, so-called undercut occurs to cause disappearance of wiring. Therefore, it is difficult to form a micro wiring by means of a semi-additive process.

PRIOR ART DOCUMENTS

Patent Documents

[Patent Document 1] Japanese Laid-Open Patent Publication No. 2006-13340
[Patent Document 2] Japanese Laid-Open Patent Publication No. 2009-149971
[Patent Document 3] Japanese Laid-Open Patent Publication No. 2006-9122
[Patent Document 4] Japanese Laid-Open Patent Publication No. 2000-297387
[Patent Document 5] Japanese Laid-Open Patent Publication No. 2003-3283
[Patent Document 6] Japanese Laid-Open Patent Publication No. 2005-213526

SUMMARY OF THE INVENTION

Problems to be Solved by the Invention

The purpose of the present invention is to provide an etching composition, wherein a chemical copper plating that is a seed layer in a semi-additive process in the production of a printed-wiring board is removed efficiently at the time of removing the chemical copper plating by etching to suppress the decrease in the wiring width and provide a good wiring form.

Means for Solving the Problems

The present inventors found an etching composition, wherein the decrease in the wiring width is suppressed and a good wiring form is obtained by efficiently removing a chemical copper plating, which is a seed layer in a semi-additive process in the production of a printed-wiring board, by etching, and thus the present invention was achieved.

Specifically, the present invention is as follows:

<1> An etching composition for a chemical copper plating for the production of a printed-wiring board according to a semi-additive process, which comprises 0.2 to 5% by mass of hydrogen peroxide, 0.5 to 10% by mass of sulfuric acid, 0.001 to 0.3% by mass of phenylurea, 0.1 to 3 mass ppm of halogen ion and 0.003 to 0.3% by mass of tetrazoles, and wherein the ratio of the dissolution rate of the chemical copper plating (Y) to the dissolution rate of an electrolytic copper plating (X) at a liquid temperature of 30° C. (Y/X) is 4 to 7.

<2> The etching composition according to item <1>, wherein the tetrazoles are at least one selected from the group consisting of 1-methyltetrazole, 1-methyl-5-ethyltetrazole, 1-ethyl-5-methyltetrazole, 1,5-dimethyltetrazole and 1,5-diethyltetrazole.

<3> The etching composition according to item <1> or <2>, which comprises 0.4 to 2.5% by mass of hydrogen peroxide, 0.8 to 6.0% by mass of sulfuric acid, 0.005 to 0.15% by mass of phenylurea, 0.3 to 2.5 mass ppm of halogen ion and 0.005 to 0.02% by mass of tetrazoles.

<4> The etching composition according to any one of items <1> to <3>, wherein the dissolution rate of the electrolytic copper plating at a liquid temperature of 30° C. (X) is 0.1 to 0.8 μm/min. and the dissolution rate of the chemical copper plating at a liquid temperature of 30° C. (Y) is 1.5 to 2.8 μm/min.

<5> A method for producing a printed-wiring board, which comprises: removing a chemical copper plating by etching using an etching composition, which comprises 0.2 to 5% by mass of hydrogen peroxide, 0.5 to 10% by mass of sulfuric acid, 0.001 to 0.3% by mass of phenylurea, 0.1 to 3 mass ppm of halogen ion and 0.003 to 0.3% by mass of tetrazoles, and wherein the ratio of the dissolution rate of the chemical copper plating (Y) to the dissolution rate of an electrolytic copper plating (X) at a liquid temperature of 30° C. (Y/X) is 4 to 7.

<6> The method for producing a printed-wiring board according to item <5>, wherein the tetrazoles are at least one selected from the group consisting of 1-methyltetrazole, 1-methyl-5-ethyltetrazole, 1-ethyl-5-methyltetrazole, 1,5-dimethyltetrazole and 1,5-diethyltetrazole.

<7> The method for producing a printed-wiring board according to item <5> or <6>, wherein the etching composition comprises 0.4 to 2.5% by mass of hydrogen peroxide, 0.8 to 6.0% by mass of sulfuric acid, 0.005 to 0.15% by mass of phenylurea, 0.3 to 2.5 mass ppm of halogen ion and 0.005 to 0.02% by mass of tetrazoles.

<8> The method for producing a printed-wiring board according to any one of items <5> to <7>, wherein the dissolution rate of the electrolytic copper plating at a liquid temperature of 30° C. (X) is 0.1 to 0.8 µm/min. and the dissolution rate of the chemical copper plating at a liquid temperature of 30° C. (Y) is 1.5 to 2.8 µm/min.

Advantageous Effect of the Invention

According to the method for producing a printed-wiring board of the present invention, in the production of a printed-wiring board by means of a semi-additive process that was conventionally difficult, a chemical copper plating that is a seed layer is selectively removed by etching to suppress the decrease in the wiring width, and this enables formation of a micro wiring. Therefore, the method has a great deal of potential in industry.

EMBODIMENTS FOR CARRYING OUT THE INVENTION

Figure 1:
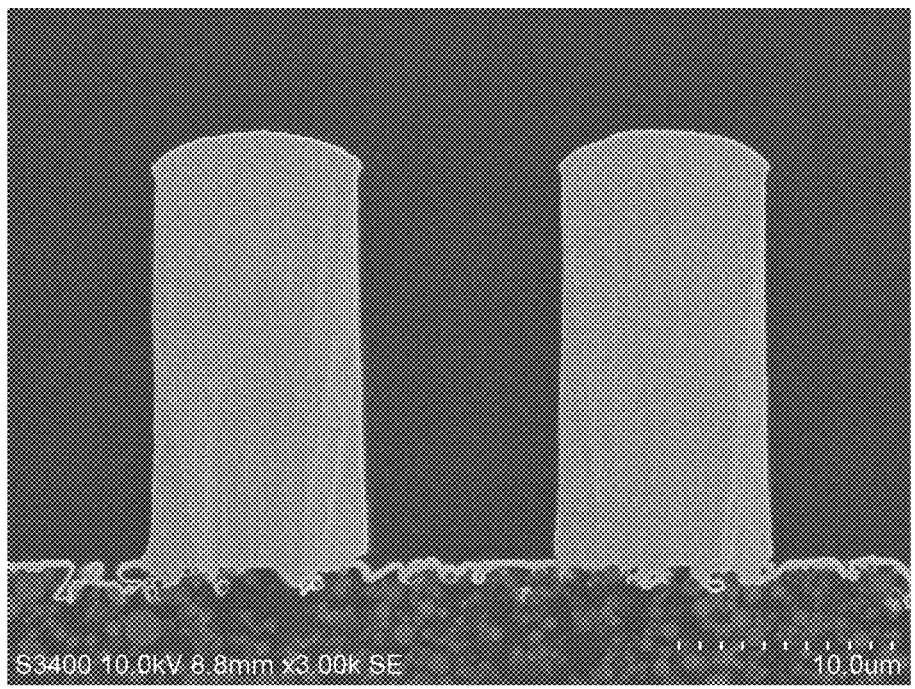
FIG. 1 is an electron microscope photograph of a cross-sectional surface of a wiring of Example 4 (untreated) (3,000×).

The etching composition of the present invention is composed of hydrogen peroxide, sulfuric acid, phenylurea, halogen ion and tetrazoles.

The concentration of hydrogen peroxide is 0.2 to 5.0% by mass, preferably 0.3 to 3.0% by mass, more preferably 0.4 to 2.5% by mass, and particularly preferably 0.5 to 2.0% by mass. Further, in the present invention, an embodiment in which the concentration of hydrogen peroxide is 1.0 to 2.0% by mass is particularly preferred. When the concentration of hydrogen peroxide is 0.2 to 5.0% by mass, a good dissolution rate of copper is obtained and it is economically excellent.

The concentration of sulfuric acid is 0.5 to 10.0% by mass, preferably 0.6 to 8.0% by mass, more preferably 0.8 to 6.0% by mass, and particularly preferably 1.0 to 5.0% by mass. Further, in the present invention, an embodiment in which the concentration of sulfuric acid is 4.0 to 5.0% by mass is particularly preferred. When the concentration of sulfuric acid is 0.5 to 10.0% by mass, a good dissolution rate of copper is obtained and it is economically excellent.

Phenylurea has the effect of adsorbing onto the copper surface to suppress thinning of a copper wiring and the effect as a stabilizer for hydrogen peroxide. The concentration of phenylurea is 0.001 to 0.3% by mass, preferably 0.003 to 0.2% by mass, more preferably 0.005 to 0.15% by mass, and particularly preferably 0.01 to 0.1% by mass. Further, in the present invention, an embodiment in which the concentration of phenylurea is 0.005 to 0.02% by mass is particularly preferred.

Halogen ion has the effect of adsorbing onto the copper surface to suppress thinning of a copper wiring. Examples of the halogen ion include fluorine ion, chloride ion, bromine ion and iodine ion, and among them, chloride ion and bromine ion are preferred. The concentration of halogen ion is 0.1 to 3 mass ppm, preferably 0.3 to 2.5 mass ppm, and particularly preferably 0.5 to 2 mass ppm.

Tetrazoles have the effect of adsorbing onto the copper surface to suppress thinning of a copper wiring like phenylurea and halogen ion. Among tetrazoles, at least one of 1H-tetrazole, 1-methyltetrazole, 1-ethyltetrazole, 5-methyltetrazole, 5-ethyltetrazole, 5-n-propyltetrazole, 5-mercaptotetrazole, 5-mercapto-1-methyltetrazole, 1-methyl-5-ethyltetrazole, 1-ethyl-5-methyltetrazole, 1,5-dimethyltetrazole, 1,5-diethyltetrazole, 1-isopropyl-5-methyltetrazole and 1-cyclohexyl-5-methyltetrazole is preferred. Particularly preferred are 1-methyltetrazole, 1-methyl-5-ethyltetrazole, 1-ethyl-5-methyltetrazole, 1,5-dimethyltetrazole and 1,5-diethyltetrazole. The concentration of tetrazoles is 0.003 to 0.3% by mass, more preferably 0.005 to 0.25% by mass, and particularly preferably 0.01 to 0.2% by mass. Further, in the present invention, an embodiment in which the concentration of tetrazoles is 0.005 to 0.02% by mass is particularly preferred.

The dissolution rate of the chemical copper plating using the etching composition of the present invention varies depending on various conditions, but for example, under a treatment condition of 30° C. (liquid temperature of 30° C.), the dissolution rate is preferably 0.4 to 3 µm/min., more preferably 0.6 to 2 µm/min., and particularly preferably 0.8 to 1.5 µm/min. Further, in the present invention, an embodiment in which the dissolution rate of the chemical copper plating at a liquid temperature of 30° C. is 1.5 to 2.8 µm/min. or 1.7 to 2.5 µm/min. is particularly preferred. Note that in the present invention, the dissolution rate of the chemical copper plating is measured according to the below-described method. That is, a substrate of chemical copper plating (size: 15 cm×15 cm, thickness of plating: 1.5 µm) is subjected to a spray treatment with an etching solution at a liquid temperature of 30° C. and a spray pressure of 0.1 MPa for 20 seconds, the amount of dissolution of copper is calculated from the difference in mass of the substrate before and after the treatment, and the dissolution rate of copper per unit time is calculated.

The dissolution rate of the electrolytic copper plating using the etching composition of the present invention varies depending on various conditions, but for example, under a treatment condition of 30° C. (liquid temperature of 30° C.), the dissolution rate is preferably 0.1 to 0.8 µm/min., more preferably 0.1 to 0.5 µm/min., even more preferably 0.15 to 0.4 µm/min., and particularly preferably 0.2 to 0.35 µm/min. Further, in the present invention, an embodiment in which the dissolution rate of the electrolytic copper plating at a liquid temperature of 30° C. is 0.3 to 0.5 µm/min. is particularly preferred. Note that in the present invention, the dissolution rate of the electrolytic copper plating is measured according to the below-described method. That is, a substrate of electrolytic copper plating (size: 15 cm×15 cm, thickness of plating: 10 µm) is subjected to a spray treatment with an etching solution at a liquid temperature of 30° C. and a spray pressure of 0.1 MPa for 20 seconds, the amount of dissolution of copper is calculated from the difference in mass of the substrate before and after the treatment, and the dissolution rate of copper per unit time is calculated.

The ratio of the dissolution rate of the chemical copper plating (Y) to the dissolution rate of the electrolytic copper plating (X) in the case of using the etching composition of the present invention (Y/X) is preferably 3 or more, more preferably 4 to 7, and particularly preferably 5 to 6. When the ratio of the dissolution rate is more than 7, undercut is accelerated to worsen the wiring form.

The operating temperature of the etching composition of the present invention is not particularly limited, but is preferably 20 to 50° C., more preferably 25 to 40° C., and even more preferably 25 to 35° C. The higher the operating temperature is, the higher the dissolution rate of copper is, but when the operating temperature exceeds 50° C., decomposition of hydrogen peroxide is accelerated and it is unfavorable.

The treatment time of the etching composition of the present invention is not particularly limited, but is preferably 1 to 600 seconds, more preferably 5 to 300 seconds, even more preferably 10 to 180 seconds, and particularly preferably 15 to 120 seconds. The treatment time is suitably selected according to various conditions such as the state of the metal surface, the concentration of the etching solution, temperature and the treatment method.

The treatment method using the etching composition of the present invention is not particularly limited, but is preferably carried out by means of immersion, spray or the like. Further, the treatment time is suitably selected according to the thickness of copper or copper alloy to be dissolved.

EXAMPLES

Hereinafter, the present invention will be specifically described by way of examples and comparative examples. However, the present invention is not limited to these examples.

Method for measuring the amount of dissolution of copper: calculation was carried out by the mass method using the following formula:

The amount of dissolution=(the mass before treatment−the mass after treatment)/(treatment area× 8.96)

Measurement of wiring width and decrease in wiring width A laser microscope (OLS-1100 manufactured by Olympus Corporation) was used.

Measurement of undercut A scanning electron microscope (S-3400N manufactured by Hitachi High-Tech Fielding Corporation) was used.

Example 1

Each of a substrate of chemical copper plating (size: 15 cm×15 cm, thickness of plating: 1.5 μm) and a substrate of electrolytic copper plating (size: 15 cm×15 cm, thickness of plating: 10 μm) was subjected to a spray treatment at a liquid temperature of 30° C. and a spray pressure of 0.1 MPa for 20 seconds using an etching solution prepared with 1% by mass of hydrogen peroxide, 4% by mass of sulfuric acid, 0.01% by mass of phenylurea, 1 mass ppm of chloride ion and 0.01% by mass of 1-methyltetrazole, the amount of dissolution of copper was calculated from the difference in mass of the substrate before and after the treatment, and the dissolution rate of copper per unit time was calculated. In addition, the rate ratio of the dissolution rate of the chemical copper plating (Y) to the dissolution rate of the electrolytic copper plating (X) (Y/X) was calculated. The result was that the rate ratio (Y/X) was 5.7.

Example 2

The process was carried out in a manner similar to that in Example 1, except that an etching solution was prepared with 1.5% by mass of hydrogen peroxide, 4.5% by mass of sulfuric acid, 0.02% by mass of phenylurea, 2 mass ppm of bromine ion and 0.01% by mass of 1-methyl-5-ethyltetrazole. The result was that the rate ratio (Y/X) was 5.0.

Example 3

The process was carried out in a manner similar to that in Example 1, except that an etching solution was prepared with 2% by mass of hydrogen peroxide, 5% by mass of sulfuric acid, 0.005% by mass of phenylurea, 0.5 mass ppm of chloride ion and 0.02% by mass of 1,5-dimethyltetrazole. The result was that the rate ratio (Y/X) was 5.0.

Comparative Example 1

The process was carried out in a manner similar to that in Example 1, except that an etching solution was prepared with 0.8% by mass of hydrogen peroxide, 4% by mass of sulfuric acid, 0.005% by mass of 5-aminotetrazole and 3 mass ppm of bromine ion. The result was that the rate ratio (Y/X) was 2.8.

Comparative Example 2

The process was carried out in a manner similar to that in Example 1, except that an etching solution was prepared with 2% by mass of hydrogen peroxide, 10% by mass of sulfuric acid and 0.05% by mass of 1-(1',2'-dicarboxyethyl)benzotriazole. The result was that the rate ratio (Y/X) was 7.3.

Comparative Example 3

The process was carried out in a manner similar to that in Example 1, except that an etching solution was prepared with 2% by mass of hydrogen peroxide, 9% by mass of sulfuric acid, 0.025% by mass of benzotriazole, 0.1% by mass of 1H-1,2,3-triazole and 0.1% by mass of sodium phenolsulfonate monohydrate. The result was that the rate ratio (Y/X) was 2.3.

Comparative Example 4

The process was carried out in a manner similar to that in Example 1, except that an etching solution was prepared with 2.5% by mass of hydrogen peroxide, 10% by mass of sulfuric acid, 0.05% by mass of 5-aminotetrazole and 0.05% by mass of phenylurea. The result was that the rate ratio (Y/X) was 2.0.

Comparative Example 5

The process was carried out in a manner similar to that in Example 1, except that an etching solution was prepared with 2% by mass of hydrogen peroxide, 9% by mass of sulfuric acid, 0.3% by mass of 5-aminotetrazole, 0.2 mass ppm of silver ion and 0.2 mass ppm of chloride ion. The result was that the rate ratio (Y/X) was 2.2.

Comparative Example 6

The process was carried out in a manner similar to that in Example 1, except that an etching solution was prepared with 1.5% by mass of hydrogen peroxide, 5% by mass of sulfuric acid, 0.3% by mass of benzotriazole and 5 mass ppm of chloride ion. The result was that the rate ratio (Y/X) was 2.3.

TABLE 1

| | Composition | Dissolution rate (μm/min) | | Rate ratio |
|---|---|---|---|---|
| | | Chemical copper | Electrolytic copper | |
| Example 1 | hydrogen peroxide: 1 wt % sulfuric acid: 4 wt % phenylurea: 0.01 wt % chloride ion: 1 ppm 1-methyltetrazole: 0.01 wt % | 1.7 | 0.3 | 5.7 |
| Example 2 | hydrogen peroxide: 1.5 wt % sulfuric acid: 4.5 wt % phenylurea: 0.02 wt % bromine ion: 2 ppm 1-methyl-5-ethyltetrazole: 0.01 wt % | 2.0 | 0.4 | 5.0 |
| Example 3 | hydrogen peroxide: 2 wt % sulfuric acid: 5 wt % phenylurea: 0.005 wt % chloride ion: 0.5 ppm 1,5-dimethyltetrazole: 0.02 wt % | 2.5 | 0.5 | 5.0 |
| Comparative Example 1 | hydrogen peroxide: 0.8 wt % sulfuric acid: 4 wt % 5-aminotetrazole: 0.005 wt % bromine ion: 3 ppm | 1.4 | 0.5 | 2.8 |
| Comparative Example 2 | hydrogen peroxide: 2 wt % sulfuric acid: 10 wt % 1-(1',2'-dicarboxyethyl)-benzotriazole: 0.05 wt % | 2.2 | 0.3 | 7.3 |
| Comparative Example 3 | hydrogen peroxide: 2 wt % sulfuric acid: 9 wt % benzotriazole: 0.025 wt % 1H-1,2,3-triazole: 0.1 wt % sodium phenolsulfonate monohydrate: 0.1 wt % | 4.5 | 2.0 | 2.3 |
| Comparative Example 4 | hydrogen peroxide: 2.5 wt % sulfuric acid: 10 wt % 5-aminotetrazole: 0.05 wt % phenylurea: 0.05 wt % | 4.0 | 2.0 | 2.0 |
| Comparative Example 5 | hydrogen peroxide: 2 wt % sulfuric acid: 9 wt % 5-aminotetrazole: 0.3 wt % silver ion: 0.2 ppm chloride ion: 0.2 ppm | 4.0 | 1.8 | 2.2 |
| Comparative Example 6 | hydrogen peroxide: 1.5 wt % sulfuric acid: 5 wt % benzotriazole: 0.3 wt % chloride ion: 5 ppm | 0.7 | 0.3 | 2.3 |

Example 4

Figure 2:
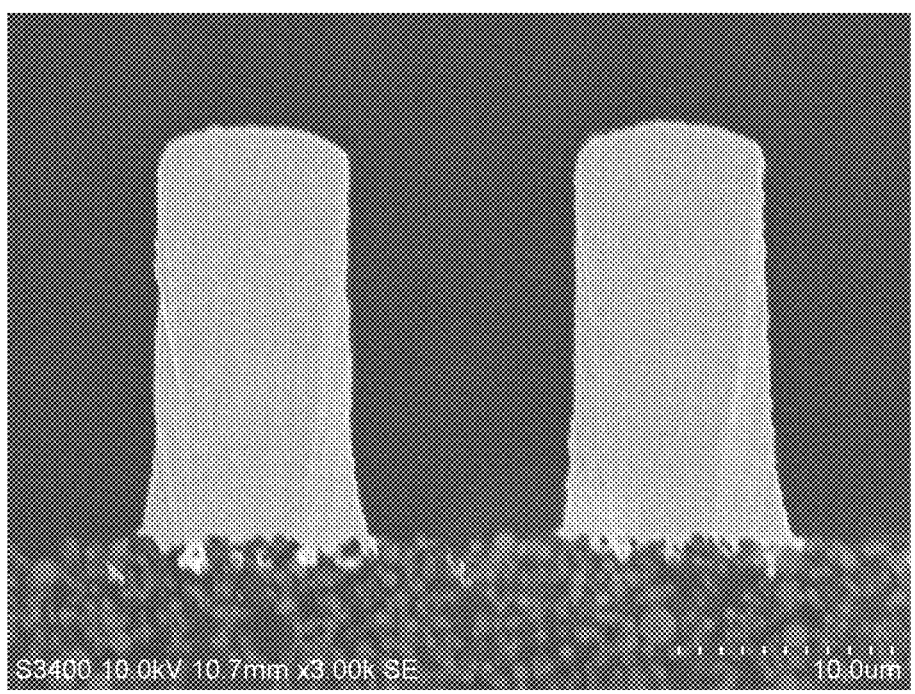
FIG. 2 is an electron microscope photograph of a cross-sectional surface of a wiring of Example 4 (3,000×).

A substrate obtained by forming a chemical copper plating having a thickness of 0.5 μm on an epoxy resin insulation substrate (size: 15 cm×15 cm) was laminated with a dry film, and exposure and development were performed to form a resist pattern. An electrolytic copper plating having a thickness of 18 μm was provided to an opening, and after that, the dry film resist was stripped with an amine-based resist stripping liquid (Mitsubishi Gas Chemical Company, Inc., product name: R-100S) to prepare a test substrate. The width of the wiring part formed by the electrolytic copper plating was measured by means of 5-point measurement with a laser microscope (Olympus Corporation, OLS-1100), and the average value thereof was 9.8 μm (FIG. 1). Next, the substrate was subjected to the spray treatment at a liquid temperature of 30° C. and a spray pressure of 0.1 MPa using an etching solution prepared with 1% by mass of hydrogen peroxide, 4% by mass of sulfuric acid, 0.01% by mass of phenylurea, 1 mass ppm of chloride ion and 0.01% by mass of 1-methyltetrazole (the composition of Example 1), and the chemical copper plating layer (thickness: 0.5 μm) was completely dissolved and removed. The time required for the dissolution and removal was 50 seconds. The dissolution and removal of the chemical copper plating layer was confirmed with a metallographic microscope (Olympus Corporation, MX61L). The width of the wiring part formed by the electrolytic copper plating was measured by means of 5-point measurement with a laser microscope (Olympus Corporation, OLS-1100), and the average value thereof was 9.5 μm, and the average value of the amount of decrease in the wiring width was 0.3 μm. The wiring was cut using an ion milling apparatus (Hitachi High-Tech Fielding Corporation, ION MILLING SYSTEM E-3500), and the cross-sectional surface of the wiring was observed with a scanning electron microscope to measure undercut. The result was that undercut was not generated (FIG. 2).

Example 5

The process was carried out in a manner similar to that in Example 4, except that an etching solution was prepared with 1.5% by mass of hydrogen peroxide, 4.5% by mass of sulfuric acid, 0.02% by mass of phenylurea, 2 mass ppm of bromine ion and 0.01% by mass of 1-methyl-5-ethyltetrazole. The result was that the average value of the amount of decrease in the wiring width was 0.4 μm and undercut was not generated.

Example 6

The process was carried out in a manner similar to that in Example 4, except that an etching solution was prepared with 2% by mass of hydrogen peroxide, 5% by mass of sulfuric acid, 0.005% by mass of phenylurea, 0.5 mass ppm of chloride ion and 0.02% by mass of 1,5-dimethyltetrazole. The result was that the average value of the amount of decrease in the wiring width was 0.4 μm and undercut was not generated.

Comparative Example 7

Figure 3:
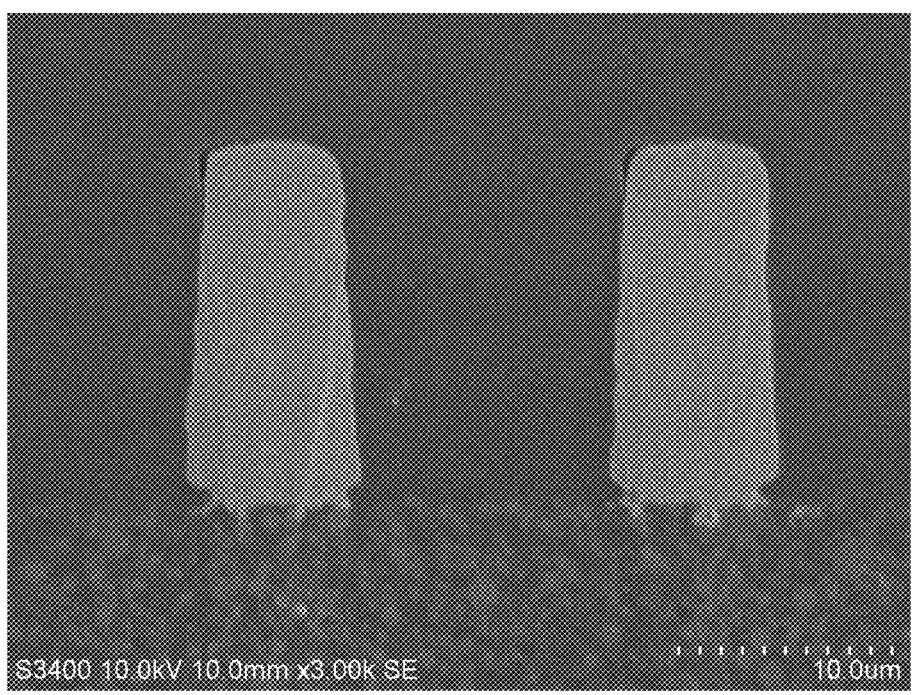
FIG. 3 is an electron microscope photograph of a cross-sectional surface of a wiring of Comparative Example 7 (3,000×).

The process was carried out in a manner similar to that in Example 4, except that an etching solution was prepared with 0.8% by mass of hydrogen peroxide, 4% by mass of sulfuric acid, 0.005% by mass of 5-aminotetrazole and 3 mass ppm of bromine ion. The result was that the average value of the amount of decrease in the wiring width was 1.4 μm and the amount of undercut was 1.2 μm (FIG. 3).

Comparative Example 8

The process was carried out in a manner similar to that in Example 4, except that an etching solution was prepared with 2% by mass of hydrogen peroxide, 10% by mass of sulfuric acid and 0.05% by mass of 1-(1',2'-dicarboxyethyl)benzotriazole. The result was that the average value of the amount of decrease in the wiring width was 0.8 μm and the amount of undercut was 1 μm.

Comparative Example 9

The process was carried out in a manner similar to that in Example 4, except that an etching solution was prepared with 2% by mass of hydrogen peroxide, 9% by mass of sulfuric acid, 0.025% by mass of benzotriazole, 0.1% by mass of 1H-1,2,3-triazole and 0.1% by mass of sodium phenolsulfonate monohydrate. The result was that the average value of the amount of decrease in the wiring width was 1.5 μm and the amount of undercut was 0.6 μm.

Comparative Example 10

The process was carried out in a manner similar to that in Example 4, except that an etching solution was prepared with 2.5% by mass of hydrogen peroxide, 10% by mass of sulfuric acid, 0.05% by mass of 5-aminotetrazole and 0.05% by mass of phenylurea. The result was that the average value of the amount of decrease in the wiring width was 1.5 μm and the amount of undercut was 0.7 μm.

Comparative Example 11

The process was carried out in a manner similar to that in Example 4, except that an etching solution was prepared with 2% by mass of hydrogen peroxide, 9% by mass of sulfuric acid, 0.3% by mass of 5-aminotetrazole, 0.2 mass ppm of silver ion and 0.2 mass ppm of chloride ion. The result was that the average value of the amount of decrease in the wiring width was 1.3 μm and the amount of undercut was 0.8 μm.

Comparative Example 12

The process was carried out in a manner similar to that in Example 4, except that an etching solution was prepared with 1.5% by mass of hydrogen peroxide, 5% by mass of sulfuric acid, 0.3% by mass of benzotriazole and 5 mass ppm of chloride ion. The result was that the average value of the amount of decrease in the wiring width was 1.0 μm and the amount of undercut was 0.6 μm.

TABLE 2

| | Composition | Decrease in wiring width (μm) | Undercut (μm) |
|---|---|---|---|
| Example 4 | hydrogen peroxide: 1 wt %<br>sulfuric acid: 4 wt %<br>phenylurea: 0.01 wt %<br>chloride ion: 1 ppm<br>1-methyltetrazole: 0.01 wt % | 0.3 | 0 |
| Example 5 | hydrogen peroxide: 1.5 wt %<br>sulfuric acid: 4.5 wt %<br>phenylurea: 0.02 wt %<br>bromine ion: 2 ppm<br>1-methyl-5-ethyltetrazole: 0.01 wt % | 0.4 | 0 |
| Example 6 | hydrogen peroxide: 2 wt %<br>sulfuric acid: 5 wt %<br>phenylurea: 0.005 wt %<br>chloride ion: 0.5 ppm<br>1,5-dimethyltetrazole: 0.02 wt % | 0.4 | 0 |
| Comparative Example 7 | hydrogen peroxide: 0.8 wt %<br>sulfuric acid: 4 wt %<br>5-aminotetrazole: 0.005 wt %<br>bromine ion: 3 ppm | 1.4 | 1.2 |
| Comparative Example 8 | hydrogen peroxide: 2 wt %<br>sulfuric acid: 10 wt %<br>1-(1',2'-dicarboxy ethyl)-benzotriazole: 0.05 wt % | 0.8 | 1.0 |
| Comparative Example 9 | hydrogen peroxide: 2 wt %<br>sulfuric acid: 9 wt %<br>benzotriazole: 0.025 wt %<br>1H-1,2,3-triazole: 0.1 wt %<br>sodium phenolsulfonate monohydrate: 0.1 wt % | 1.5 | 0.6 |
| Comparative Example 10 | hydrogen peroxide: 2.5 wt %<br>sulfuric acid: 10 wt %<br>5-aminotetrazole: 0.05 wt %<br>phenylurea: 0.05 wt % | 1.5 | 0.7 |
| Comparative Example 11 | hydrogen peroxide: 2 wt %<br>sulfuric acid: 9 wt %<br>5-aminotetrazole: 0.3 wt %<br>silver ion: 0.2 ppm<br>chloride ion: 0.2 ppm | 1.3 | 0.8 |
| Comparative Example 12 | hydrogen peroxide: 1.5 wt %<br>sulfuric acid: 5 wt %<br>benzotriazole: 0.3 wt %<br>chloride ion: 5 ppm | 1.0 | 0.6 |

INDUSTRIAL APPLICABILITY

From the results in Tables 1 and 2, it is understood that the rate ratio of the dissolution rate of the chemical copper plating (Y) to the dissolution rate of the electrolytic copper plating (X) (Y/X) becomes 4 to 7 when performing the treatment with the etching solution of the present invention, which enables selective dissolution of the chemical copper plating, and that therefore the decrease in the wiring width is suppressed and a good wiring form is obtained (without generation of undercut).

The invention claimed is:

1. An etching composition for a chemical copper plating for the production of a printed-wiring board according to a semi-additive process, which comprises
   0.2 to 5% by mass of hydrogen peroxide,
   0.5 to 10% by mass of sulfuric acid,
   0.001 to 0.3% by mass of phenylurea,
   0.1 to 3 mass ppm of halogen ion and
   0.003 to 0.3% by mass of tetrazoles,
   and wherein the ratio of the dissolution rate of a chemical copper plating (Y) dissolved by the composition to the dissolution rate of an electrolytic copper plating (X) dissolved by the composition at a liquid temperature of 30° C. (Y/X) is 4 to 7.

2. The etching composition according to claim 1, wherein the tetrazoles are at least one selected from the group consisting of 1-methyltetrazole, 1-methyl-5-ethyltetrazole, 1-ethyl-5-methyltetrazole, 1,5-dimethyltetrazole and 1,5-diethyltetrazole.

3. The etching composition according to claim 1, which comprises
   0.4 to 2.5% by mass of hydrogen peroxide,
   0.8 to 6.0% by mass of sulfuric acid,
   0.005 to 0.15% by mass of phenylurea,
   0.3 to 2.5 mass ppm of halogen ion and
   0.005 to 0.02% by mass of tetrazoles.

4. The etching composition according to claim 1, wherein the dissolution rate of the electrolytic copper plating at a liquid temperature of 30° C. (X) is 0.1 to 0.8 μm/min. and the dissolution rate of the chemical copper plating at a liquid temperature of 30° C. (Y) is 1.5 to 2.8 μm/min.

5. A method for producing a printed-wiring board, which comprises:
removing a chemical copper plating by etching using the etching composition according to claim 1.

6. The method for producing a printed-wiring board according to claim 5, wherein the tetrazoles are at least one selected from the group consisting of 1-methyltetrazole, 1-methyl-5-ethyltetrazole, 1-ethyl-5-methyltetrazole, 1,5-dimethyltetrazole and 1,5-diethyltetrazole.

7. The method for producing a printed-wiring board according to claim 5, wherein the etching composition comprises 0.4 to 2.5% by mass of hydrogen peroxide, 0.8 to 6.0% by mass of sulfuric acid, 0.005 to 0.15% by mass of phenylurea, 0.3 to 2.5 mass ppm of halogen ion and 0.005 to 0.02% by mass of tetrazoles.

8. The method for producing a printed-wiring board according to claim 5, wherein the dissolution rate of the electrolytic copper plating at a liquid temperature of 30° C. (X) is 0.1 to 0.8 μm/min. and the dissolution rate of the chemical copper plating at a liquid temperature of 30° C. (Y) is 1.5 to 2.8 μm/min.

* * * * *